United States Patent
Yueh

(12) 
(10) Patent No.: US 6,329,631 B1
(45) Date of Patent: Dec. 11, 2001

(54) SOLDER STRIP EXCLUSIVELY FOR SEMICONDUCTOR PACKAGING

(76) Inventor: Ray Yueh, 14F-6, No. 230, Hsin I Road, Section 2, TA AN(106), Taipei (TW)

( * ) Notice: Subject to any disclaimer, the term of this patent is extended or adjusted under 35 U.S.C. 154(b) by 0 days.

(21) Appl. No.: 09/390,638

(22) Filed: Sep. 7, 1999

(51) Int. Cl.[7] .............................. B23K 26/20; B23K 35/02
(52) U.S. Cl. ...................................... 219/121.65; 228/56.3
(58) Field of Search ............................. 228/56.3, 180.22, 228/248.1; 219/121.65, 121.66, 121.85, 121.6

(56) References Cited

U.S. PATENT DOCUMENTS

| | | | |
|---|---|---|---|
| 4,728,022 | * | 3/1988 | Jamison ............................. 228/56.3 |
| 4,767,344 | * | 8/1988 | Noschese ............................... 439/83 |
| 4,832,255 | * | 5/1989 | Bickford et al. ...................... 228/254 |
| 4,887,760 | * | 12/1989 | Yoshino et al. ..................... 228/56.3 |
| 5,388,327 | * | 2/1995 | Trabucco ............................... 29/830 |
| 5,775,569 | * | 7/1998 | Berger et al. ......................... 228/254 |
| 5,796,590 | * | 8/1998 | Klein ..................................... 361/774 |
| 5,950,908 | * | 9/1999 | Fujino et al. ....................... 228/248.1 |
| 5,957,370 | * | 9/1999 | Galloway .......................... 228/180.22 |

\* cited by examiner

*Primary Examiner*—Samuel M. Heinrich
(74) *Attorney, Agent, or Firm*—Dougherty & Troxell

(57) ABSTRACT

A transparent plastic solder strip being provided with a plurality of solder holes for each accommodating an amount of solder paste therein. These solder holes have a very small diameter and are uniformly and densely distributed throughout the solder strip in a specific pattern, such that a proper density of the solder hole on the solder strip is obtained to always allow sufficient number of solder holes to be covered in an applied area for sufficient amount of solder paste to be melted by laser beams and transferred from the solder strip to islands on a BGA carrier for bonding the carrier to a semiconductor device. It is no longer necessary to register the solder holes with the islands on the carrier to complete the solder transfer.

1 Claim, 1 Drawing Sheet

SOLDER STRIP EXCLUSIVELY FOR SEMICONDUCTOR PACKAGING

BACKGROUND OF THE INVENTION

The present invention relates to a solder strip exclusively for semiconductor packaging, and more particularly to a solder strip having solder holes arranged thereon in an improved pattern. The solder holes on the solder strip of the present invention have reduced diameter and properly increased density and are uniformly arranged in a specified pattern throughout the solder strip that is made of transparent plastic material, so that the solder strip may be used on a BGA carrier having any kind of metallic island layout to always provide sufficient number of solder holes relative to each metallic island and accordingly supply sufficient amount of liquefied solder on each island for bonding purpose.

Semiconductor devices typically include a plurality of components formed by photolithographic processes in a multi-layered structure. The structure is supplied with signals typically via a sunburst pattern that makes electrical contact to lands on the semiconductor device. For completing the packaging of the device, the sunburst pattern is connected to external signal and power sources for the device to operate and the device is protected from the environment.

One technology for completing the semiconductor package is termed a Ball Grid Array (BGA). The BGA comprises a planar component "carrier" that may comprise a rigid plastic layer with metallic (gold) islands or dots on a top surface thereof. The dots are connected to lands on a bottom surface of the carrier by through connections that provide electrical continuity from the power and signal sources to the metallic dots. The BGA, thus, is employed as a support or carrier for the semiconductor device and as a medium for providing the requisite drive and signals to the attached semiconductor device.

The semiconductor device, accordingly, has to be connected to the carrier in a manner to permit electrical continuity. To this end, it is necessary to provide solder on top of each of the gold dots on the top surface of the carrier to bond the semiconductor securely in place.

In recent years, there are various technical means developed to provide solder on the tops of dots on the carrier and to melt the solder to bond the semiconductor to the carrier. One of these technical means for bonding the semiconductor to the carrier is to place a solder strip in contact with the carrier on which the island or dot array is formed. A laser is scanned over the surface of the solder strip and pulsed in registry with the positions of each of the gold islands or dots. The solder is liquefied where impacted by the laser beam and thus, solder is transferred to the dots. Wherein, the laser can be raster scanned over the carrier and pulsed at each position of the islands or dots, or a laser diode array to supply a pulse to the solder strip over each row of islands or dots simultaneously. Or, a fiber fan can be used to supply pulses, a row at a time, from a single laser diode source. Or, the solder can be provided on the carrier at only selected ones of the islands or dots.

The solder strip used in the above-mentioned prior technical means includes a strip, that is, a carrier of the solder, that must be made of an insulating material or a material having very small coefficient of heat transfer, because any heat transfer and radiation effect of the strip would prevent the laser pulses from melting solder set in the solder holes on the strip, and the solder would not be transferred onto the islands on the BGA carrier as expected. Generally, the solder strip may be made of transparent plastic material, such as the rigid plastic sheet for making projection slide. The solder strip must also have adequate thickness and is provided with a plurality of holes into which solder paste is filled.

However, the above-mentioned solder strip has following limitations in its design and use:

1. Solder holes provided on the solder strip must be arranged in a pattern exactly corresponding to the layout of the islands or dots on the BGA carrier. When the BGA carrier has a different layout of islands or dots, a separate solder strip must be prepared to have a solder hole pattern consistent with the island or dot layout on the BGA carrier. Therefore, it necessitates disadvantageously increased cost to prepare and make the solder strip.

2. In the process of transferring the solder to the islands or dots on the BGA carrier, it is a must to register the solder holes with the islands or dots on the carrier for a laser beam to direct at the holes and melt the solder paste therein. That is, the solder strip and the BGA carrier must be moved synchronously and the laser must be activated simultaneously. Although this process is not a problem in terms of the currently available automated apparatus for this purpose, it nevertheless increases limitations in the operation of such apparatus.

3. The solder paste transferred from the solder strip to the islands on the BGA carrier is substantially in the form of a ball due to surface tension. Each of the solder balls must have specified height and size and it is a minimum requirement that the solder ball could never flood beyond the discrete islands. Therefore, the size of the holes on the solder strip, the amount of solder paste filled in the respective holes, and the accuracy of the registry of the holes with the islands on the BGA carrier all have important and critical influence on the transfer of the molten solder paste to the islands. That is, the manufacture of the solder strip is very troublesome.

Therefore, it is desirable to develop an improved solder strip to eliminate the above-mentioned disadvantages.

SUMMARY OF THE INVENTION

A primary object of the present invention is to provide an improved solder strip exclusively for semiconductor packaging. The solder strip of the present invention is provided with a plurality of solder holes that have largely reduced diameter and are uniformly and densely arranged in a specific pattern. Therefore, a uniformly structured solder strip can be applied for use on any type of BGA carrier to complete the placement of solder on the carrier and the bonding of the carrier to a semiconductor device.

DETAILED DESCRIPTION OF THE PREFERRED EMBODIMENTS

Figure 1:
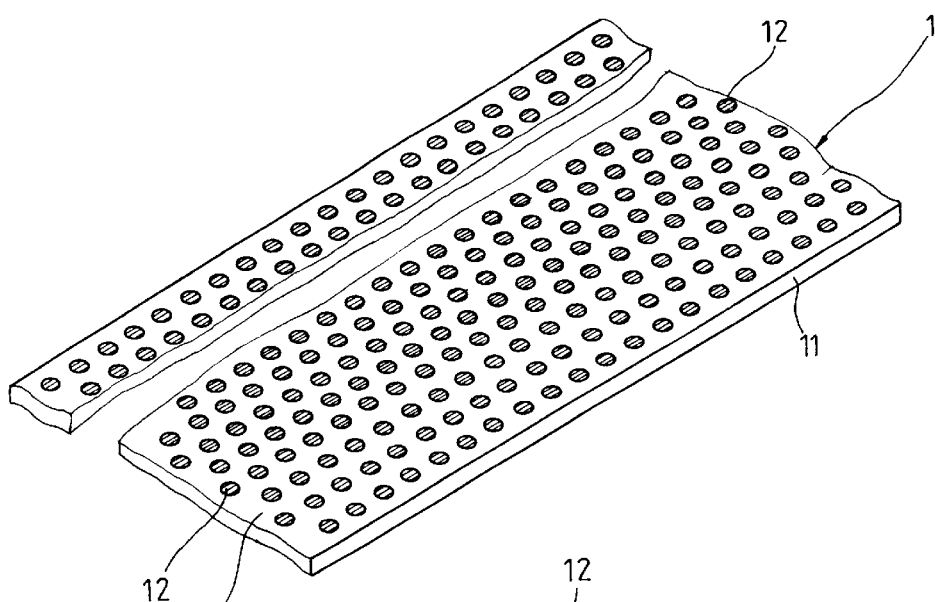
FIG. 1 is a fragmentary and enlarged perspective of a solder strip according to the present invention.
Figure 2:
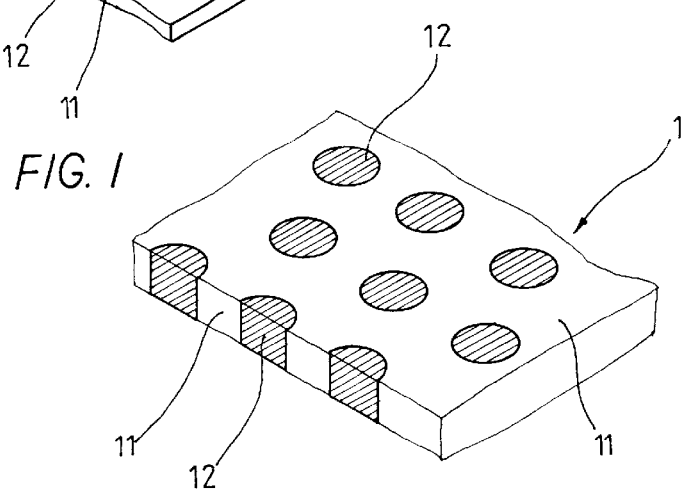
FIG. 2 is a fragmentary and enlarged perspective sectional view of the solder strip of FIG. 1.

Please refer to FIGS. 1 and 2 in which a solder strip 1 according to the present invention is shown. The solder strip 1 mainly includes a strip body (or solder carrier) 11 and a plurality of solder holes 12 provided on the strip body 11.

The strip body 11 must be formed from an insulating material or a material having very small coefficient of heat transfer. Generally, the strip body 11 may be formed from a transparent plastic material, such as the stiff plastic sheet used to make projection transparencies. The strip body 11 may have a length depending on the apparatus and other associated devices used in the semiconductor device packaging. The strip body 11 may have a width in the range from 1 mm to 2 mm.

Figure 3:
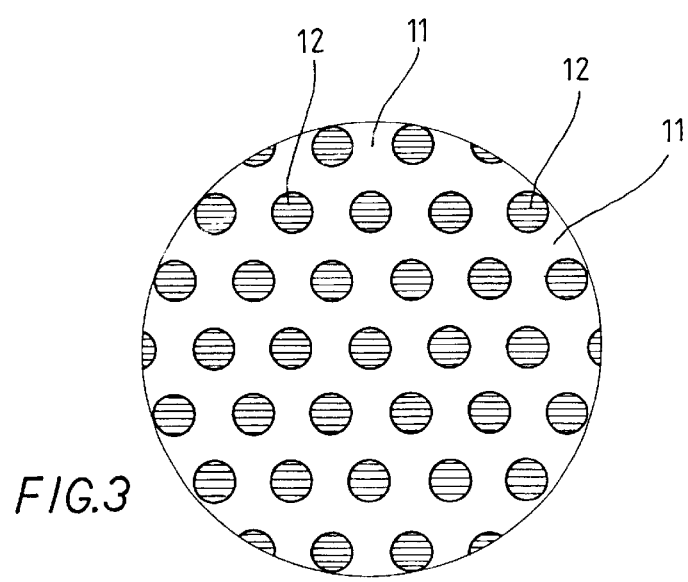
FIG. 3 is a fragmentary and enlarged top view of the solder strip of FIG. 1 showing the solder holes within a circular area.

The solder holes 12 are uniformly arranged on the strip body 11 in a properly high density. After the solder holes 12 are formed on the strip body 11, they are filled with solder paste. In view that the existing BGA carriers to be bonded to semiconductor devices through soldering usually have islands having a diameter in the range from about 300 to about 500 $\mu$m (or micrometer, or $10^{-6}$ m), and this size can be even reduced to the range from about 70 to about 150 $\mu$m with the currently available technique in this field, the solder holes 12 on the solder strip 1 of the present invention are designed to have a diameter of 10 $\mu$m each and are spaced at a uniform interval of 10 $\mu$m. FIG. 3 illustrates the uniform layout of the solder holes 12 on the strip body 11 according to the present invention. This layout allows the solder holes 12 to properly densely distribute throughout the strip body 11.

Since the existing laser apparatus used in the semiconductor device packaging can emit laser beams having optically adjustable diameters in the range from several decade micrometers to several hundred micrometers, there shall be always sufficient number of solder holes 12 covered by these laser beams, either several decade or several hundred micrometers in diameter, directed at the solder strip 1 each time. That is, there should always be sufficient amount of solder paste melted and transferred from the solder holes 12 to the islands on the BGA carriers when the solder strip 1 is scanned with laser. As shown in FIG. 3, with each solder hole 12 being 10 $\mu$m in diameter and each interval between two adjacent solder holes 12 being 10 $\mu$m, too, there would be about 32 solder holes 12 covered by a laser beam about 120 $\mu$m in diameter. This density of solder holes 12 together with a predetermined height of the solder holes 12 (that is, a thickness of the strip body 11) would allow the production of sufficient amount of solder paste for the solder transfer.

Moreover, it is not difficult to achieve registry of the laser beams with the islands on the BGA carrier through the currently available technique. To use the solder strip 1 of the present invention, it is positioned between a laser apparatus and a BGA carrier above islands on the BGA carrier. By synchronously moving the solder strip 1 and the BGA carrier with the laser apparatus activated, there should always be solder paste in the solder holes 12 melted and transferred from the solder strip 11 to the islands on the BGA carrier. That is, with the solder strip 1 of the present invention on which a plurality of very fine solder holes 12 are uniformly and densely provided, it is no longer necessary to accurately register each solder hole with an island on the BGA carrier as otherwise required in the conventional solder strip that has larger solder holes loosely arranged thereon. And, with the solder strip 1 of the present invention, laser beams directed at the solder strip 1 can be easily controlled to have their diameter always slightly smaller than that of the islands on the BGA carrier to effectively prevent the melted and transferred solder paste from overflowing the islands on the BGA carrier. In brief, the design of distributing fine solder holes 12 uniformly and densely throughout the solder strip 1 of the present invention indeed simplifies the process and apparatus for melting and transferring the solder from the solder strip to the BGA carrier to complete the bonding of the BGA carrier to the semiconductor devices.

When a solder strip 1 of the present invention has been used, a part of the solder holes 12 thereon become empty because the solder paste filled therein is melted and transferred. At this point, the used solder strip 1 maybe either refilled with solder paste or simply discarded, depending on actual need or considerations on cost. In either way, there is not any problem from the technical viewpoint.

Experiments and tests indicate that the height and size of solder balls located at the islands on the BGA carrier can be controlled to be within desired conditions by controlling the thickness of the solder strip and the dimensions of the solder holes, as well as by the available very accurate instantaneous control over the laser pulses. Furthermore, by blowing circulating purified nitrogen gas toward the solder strip and the BGA carrier during the process of directing laser beams at the solder strip, every solder balls located at individual islands on the BGA carrier would have a uniform diameter.

The solder paste used in the semiconductor packaging is usually a tin lead solder. When such solder paste is melted by laser beams directed at it, the tin contained in the solder paste will volatilize into gas under high temperature, making the solder balls on the islands of the BGA carrier have a changed ratio of tin to lead. When such change in the ratio of tin to lead in the solder balls is too big, change in the bonding ability of the solder would occur to result in change of conductivity after the semiconductor devices have been used for a prolonged time. Following are some ways to solve the problem of decreased tin in the solder and the resultant possibly degraded conductivity:

1. Adjust the duration and peak power of laser pulses so as to minimize the volatilization of tin and to avoid pollution and deposition of tin molecules resulted from over volatilization of tin. The blowing of circulating pure nitrogen gas in the process of solder transfer as mentioned above is also helpful in reducing the pollution caused by volatilized tin.

2. Prepare a solder paste containing increased tin, so that the ratio of tin to lead in the solder paste after a part of tin has been volatilized under the high temperature caused by laser beams would be within a range for the solder to provide the optimal bonding property thereof.

The above are the possible solutions to the conditions of volatilized and accordingly decreased tin in the solder that would occur during the use of the solder strip of the present invention. However, it is to be understood that such possible changes in the property of material have no direct relation to the structure of the present invention. The purpose of mentioning such changes in material is simply to make the solder strip of the present invention perfect in use.

What is claimed is:

1. A solder strip exclusively for semiconductor packaging comprising a strip body having a width in the range of 1 mm. to 2 mm. and made of a stiff transparent plastic material and having a predetermined thickness, and a plurality of solder holes provided in said strip body, each of said solder holes accommodating a predetermined amount of solder paste therein, said solder paste in said solder holes being melted and downward transferred from said solder holes to islands on a BGA carrier positioned below said solder strip by directing laser beams at said solder strip, said solder strip being characterized in that said solder holes have a diameter of 10 $\mu$m and are uniformly and densely distributed throughout said solder strip in a predetermined pattern, such that a proper density of said solder holes on said solder strip is obtained to provide a sufficient number of said solder holes to be covered in an area equal to the size of one of said islands on said BGA carrier, and to provide a sufficient amount of solder paste to be melted and transferred from said solder holes to said islands for bonding said BGA carrier to a semiconductor to complete said semiconductor packaging and wherein said plurality of solder holes of 10 $\mu$m in diameter are distributed on said solder strip in a uniform pattern in which every two adjacent solder holes on said solder strip are spaced at an interval of 10 $\mu$m.

* * * * *